US008344468B2

(12) United States Patent
Roizin et al.

(10) Patent No.: US 8,344,468 B2
(45) Date of Patent: Jan. 1, 2013

(54) PHOTOVOLTAIC DEVICE WITH LATERAL P-I-N LIGHT-SENSITIVE DIODES

(75) Inventors: Yakov Roizin, Afula (IL); Evgeny Pikhay, Haifa (IL)

(73) Assignee: Tower Semiconductor Ltd., Migdal Haemek (IL)

( * ) Notice: Subject to any disclaimer, the term of this patent is extended or adjusted under 35 U.S.C. 154(b) by 21 days.

(21) Appl. No.: 13/110,856

(22) Filed: May 18, 2011

(65) Prior Publication Data
US 2012/0292675 A1 Nov. 22, 2012

(51) Int. Cl.
*H01L 27/14* (2006.01)
*H01L 31/042* (2006.01)
*H01L 31/00* (2006.01)
*H01L 21/00* (2006.01)

(52) U.S. Cl. .......... 257/431; 136/244; 136/256; 438/57; 438/66

(58) Field of Classification Search .......... 257/414, 257/428, 431, 656; 438/48, 57, 66; 136/244, 136/249, 252, 256
See application file for complete search history.

(56) References Cited

U.S. PATENT DOCUMENTS

| 4,341,918 | A | | 7/1982 | Evans, Jr. et al. | |
|---|---|---|---|---|---|
| 5,584,308 | A | * | 12/1996 | Maekawa | 132/203 |
| 6,111,305 | A | * | 8/2000 | Yoshida et al. | 257/656 |
| 6,281,428 | B1 | | 8/2001 | Chiu et al. | |
| 2010/0026192 | A1 | * | 2/2010 | Hadwen et al. | 315/149 |
| 2012/0049242 | A1 | * | 3/2012 | Atanackovic et al. | 257/184 |

FOREIGN PATENT DOCUMENTS
WO WO2010/121309 * 10/2010

OTHER PUBLICATIONS

Zhao et al. "Twenty-four percent efficient silicon solar cells with double layer antireflection coatings and reduced resistance loss", Appl. Phys. Lett. 66 (26), Jun. 26, 1995, pp. 3636-3638.

* cited by examiner

*Primary Examiner* — Matthew Reames
*Assistant Examiner* — Nikolay Yushin
(74) *Attorney, Agent, or Firm* — Bever, Hoffman & Harms, LLP; Patrick T. Bever

(57) ABSTRACT

A photovoltaic device includes lateral P-I-N light-sensitive diodes respectively formed in portions of a planar semiconductor material (e.g., polycrystalline or crystalline silicon) layer that is entirely disposed on an insulating material (e.g., SiO2) layer utilizing, e.g., STI or SOI techniques. Each light-sensitive diode includes parallel elongated doped regions respectively formed by P+ and N+ dopant extending entirely through the semiconductor layer material and separated by an intervening elongated intrinsic (native) region. The light-sensitive diodes are connected in series by patterned conductive (e.g., metal film) structures. Optional bypass diodes are formed next to each lateral P-I-N light-sensitive diodes. Optional trenches are defined between adjacent light-sensitive diodes. The photovoltaic devices are either utilized to form low-cost embedded low power photovoltaic arrays on CMOS IC devices, or produced on low-cost SOI substrates to provide, for example, low-cost, high voltage solar arrays for solar energy concentrators.

22 Claims, 10 Drawing Sheets

PHOTOVOLTAIC DEVICE WITH LATERAL P-I-N LIGHT-SENSITIVE DIODES

FIELD OF THE INVENTION

This invention relates to photovoltaic devices, and particularly to photovoltaic devices including P-I-N light sensitive diodes.

BACKGROUND OF THE INVENTION

High voltage low-power photovoltaic sources have a variety of applications including solar chargers, wireless sensors and detectors, different portable consumer products, self-powered light detectors, energy sources for driving MEMS engines, etc. Many of the state of the art integrated circuits (ICs) are capable of operating at microwatt power consumption levels that can be obtained from photovoltaic cells fabricated on the same silicon chip as the IC. Such photovoltaic HV sources can also be used for continuous charging of batteries in power management systems to prevent total discharge and enabling energy savings. If the output of the photoelectric source is high enough, it can be connected to a battery or energy storage capacitor (supercapacitor) to allow higher current peak values. The resulting energy harvesting system strongly increases the application field covering long-range RFID systems, smart dust products, etc.

There are two conventional approaches in integrating photovoltaic sources into the silicon IC.

The first conventional approach is to use conventional low-voltage (single p-n junction) photovoltaic elements and dc-dc boost converters capable of increasing the low-level input voltages to the levels of the IC system voltage (Vdd). This approach is utilized, for example, in products such as LTC 3108 produced by Linear Technology Corporation of Milpitas, Calif., USA. This approach requires a complicated analog circuit, and faces many challenges related to the need to process very low signals and distinguish them from stray voltages.

The second conventional approach is to connect the individual solar cells (p-n junction) in series on silicon (not the external connection of silicon dice). Some companies (e.g., Clare, an IXYS Company, of Beverly, Mass., USA) fabricate specialized chips that generate voltages up to several volts by connecting individual solar cells on the chip (e.g., Clare's CPC1822-CPC1832 products).

In most cases, in order to obtain high voltages, solar cells are fabricated at the isolated areas of silicon and then connected in series or series-and-parallel combinations.

A standard photovoltaic p-n diode cell typically generates from 0.4 to 0.7 V under illumination by the sunlight. The connection of photovoltaic elements can be, of course, external, if the solar cells are on separate silicon substrates (separate wafers). This is what can be found in most commercial solar energetics systems. It is clear that external connections strongly increase the system cost and decrease reliability. In case of working with light concentrators, the problem of connections becomes a bottleneck since the currents from individual solar wafers reach tens and hundreds of Amperes. HV cells solve the problem by decreasing the current for the same light power per unit square of the solar array surface.

Several solutions have been proposed to make HV solar cells on one silicon substrate.

A high voltage multi-junction solar cell is disclosed in U.S. Pat. No. 4,341,918 (Evans, et. al), where a plurality of discrete voltage generating regions or unit cells are formed in a single generally planar semiconductor body. The unit cells comprise doped regions of opposite conductivity type separated by a gap or undiffused region. Metal contacts connect adjacent cells together in series so that the output voltages of the individual cells are additive. A problem with this approach is that special metallization is needed by forming a pattern of parallel bars of aluminum paste that is screen-printed on the surface and fired to assure penetration of the aluminum through the diffused N+ region on this face and to make connection to P+ regions. Another problem is that the output voltage is limited since the common P-type base shunts the serially connected individual N+P (base) junctions.

Attempts to isolate the elements comprising the high-voltage where SOI isolation was employed are disclosed, for example, in U.S. Pat. No. 6,281,428 (Chiu et. al). Chiu teaches using the oxide layer of the SOI wafer as the isolating layer. The approach makes use of serially connected transverse photovoltaic cells formed by diffusions using special masks (six masks together with a special mask forming a mesa structure on the peripheral region to isolate the light-sensitive array). The photosensitive diodes are connected in series by metal plugs. Light enters the photosensitive array through dielectric layers.

The limitation of the approach taught by Chiu is the large number of additional masks specially added to the SOI core process in case of thin silicon on insulator layers. Also, for the mentioned thick Si substrates it is difficult to reach the bottom oxide-BOX (32) interface with the P+ diffusion, making the proposed P+-p device structure problematic.

What is needed is a photovoltaic device that addresses the problems listed above and can be produced using a standard process flow (or with minimal additional masks).

SUMMARY OF THE INVENTION

The present invention is directed to a photovoltaic device including a series of lateral P-I-N light-sensitive diodes respectively formed in parallel elongated portions of a planar semiconductor material layer (e.g., crystalline or polycrystalline silicon) that is entirely disposed on an insulating (e.g., dielectric) material layer. Each light-sensitive diode includes parallel elongated P+ and N+ doped regions respectively formed by P+ and N+ dopant extending entirely through the semiconductor layer material (i.e., from the planar upper surface to the underlying dielectric material), and an intervening elongated intrinsic (native) region of the semiconductor material layer that separates the elongated P+ and N+ doped regions. Patterned conductive (e.g., metal film) structures connect the P+ doped region of one light-sensitive diode to the N+ doped region of an adjacent light-sensitive diode, whereby all of the light-sensitive diodes are connected in series. A benefit of the disclosed photovoltaic device is that the associated fabrication processes can be easily integrated into standard process flows (e.g., established CMOS, PM CMOS, or MEMS process flows) without requiring any (or requiring very few) additional masks. For example, in one embodiment the light-sensitive diodes are formed on the 0.1 um to 0.5 um thick polycrystalline silicon layer typically formed on silicon dioxide insulation layers during standard shallow trench isolation (STI) processes often used in CMOS process flows. In an alternative exemplary embodiment, the light-sensitive diodes are formed on a thin (0.1 um to 40 um thick) crystalline silicon layer typically formed on a dielectric substrate during silicon-on-insulator (SOI) processes that are often utilized in power-management CMOS (PM CMOS) or process flows developed for fabricating microelectromechanical system (MEMS) devices. By forming the light-sensitive diodes using existing (or only slightly modified) process flows, the present invention enables low-cost embedded low power photovoltaic arrays that can be integrally formed as part of a CMOS IC (electronic) device (e.g., PM, MEMS, RFID and other mixed signal/RFCMOS devices). Alternatively, the disclosed photovoltaic device can be produced on low-cost SOI substrates (e.g., crystalline or polycrystalline silicon on glass) to provide, for example, low-cost, high voltage solar arrays for solar energy concentrators. The patterned conductive structures are also easily formed using available or otherwise low-cost metallization processes (e.g., silicide, aluminum and/or titanium films generated as part of standard CMOS processing, or low cost aluminum films or extruded conductive paste in the case of low-cost SOI substrate processing), or any other conductive material forming low-resistance contacts with Si such as a titanium-nitride stack, gold, or tungsten.

According to a first specific "flat surface" embodiment of the present invention, the semiconductor layer portions are sequentially arranged sections of a contiguous semiconductor layer structure having an unbroken flat (planar) upper surface, where an intervening intrinsic portion of the contiguous semiconductor layer structure is disposed between each adjacent pair of lateral P-I-N light-sensitive diodes. In this embodiment, the flat upper surface of the intervening intrinsic portion serves as a bridge (platform) for the electrically conductive structure are formed, which in one embodiment are formed with portions that overlap corresponding upper surface portions of adjacent light-sensitive diodes. This arrangement is particularly suited to incorporation into standard CMOS process flows, where the contiguous semiconductor layer structure is polycrystalline silicon formed on silicon dioxide as part of the STI process, and the electrically conductive structures comprises strips of silicide that are formed on the polycrystalline silicon in accordance with standard CMOS metallization. In a practical embodiment, twenty lateral P-I-N light-sensitive diodes were formed on an isolated polycrystalline silicon pad and used to control a MOS transistor in response to the applied light.

According to another specific embodiment of the present invention, bypass diodes are connected in parallel (but opposite in polarity) with each lateral light-sensitive diode to prevent the so-called "hot spot" effect experienced in serially connected photovoltaic cell arrays. According to a specific embodiment, each bypass diode is formed by spaced-apart N+ and P+ diffusions disposed in each semiconductor layer portion, with each N+ diffusion laterally positioned next to the elongated P+ and region of an associated lateral light-sensitive diode, and each P+ diffusion laterally positioned next to the elongated N+ and region of the associated lateral light-sensitive diode. This arrangement simplifies the fabrication process because the proper parallel connection of the bypass diodes is achieved by extending the electrically conductive structure such that it connects the respective P+ and N+ diffusion regions of adjacent bypass diodes. In one specific embodiment, each bypass diode has a lateral width (size) that is approximately $1/10^{th}$ of that of its associated lateral light-sensitive diodes.

According to another embodiment of the present invention, each of the elongated P+ doped regions and each of the elongated N+ doped regions includes a corresponding side wall extending from the upper surface to the lower surface of each semiconductor layer portions such that a trench is defined between each adjacent pair of semiconductor layer portions (i.e., such that each semiconductor layer portion is entirely separated from all adjacent semiconductor layer portions by an associated trench). The benefit of separating each of the lateral photo-sensitive diodes is that this arrangement facilitates thicker semiconductor layer portions, which provides for increased light conversion efficiency. In one specific embodiment, the electrically conductive structures are formed on the side walls of each adjacent pair of semiconductor layer portions and across the portion of insulating layer disposed within each trench. In another specific embodiment, a polycrystalline silicon portion is disposed in each trench, and the electrically conductive structures are formed on the polycrystalline silicon portions in order to minimize the P+ and N+ area contacted by the electrically conductive structures.

According to another embodiment of the present invention, the photovoltaic devices described above are fabricated by forming a semiconductor layer on an insulating layer, forming a series of lateral light-sensitive diodes by diffusing P+ and N+ dopant into spaced-apart elongated regions of corresponding portions of a semiconductor layer that is entirely disposed on an insulating layer, and then forming electrically conductive (metal) structures between adjacent pairs of the lateral light-sensitive diodes such that the lateral light-sensitive diodes are connected in series. In one specific embodiment, the diffusion is performed by implanting P+ and N+ dopants into the silicon layer material, and then performing thermal treatment to cause the dopants to diffuse entirely through said silicon layer. An optional silicon etch is performed to generate trenches between each adjacent pair of silicon layer portions such that each portion has opposing side walls. An optional passivation (e.g., silicon dioxide $SiO_2$ and/or silicon nitride SiN) are formed on the side walls of the trenches before metallization to suppress recombination effects. In one specific embodiment, the P+ and N+ dopants are respectively implanted in the upper surfaces of the silicon and then driven in before trench formation. In another specific embodiment, the trenches are first formed, and then P+ and N+ doped regions are respectively formed using directional implants processes such that the P+ dopant is directed in a first angular direction onto the entire length of each side wall surface facing a first direction (side walls facing the opposite direction are shielded from the directional implant), and the N+ dopant is directed in a second angular direction onto the side wall surfaces facing the opposite direction. In another specific embodiment, the trenches are filled with polycrystalline silicon that is then etched back to a level below the upper surface of the doped silicon, and then cleaned using a wet/dry etch to remove passivation (e.g., $SiO_2$) before formation of the electrically conductive structures. The metallization is placed at the exposed part of the trenches over the polysilicon such that the metallization is in contact with the silicon, and involves depositing a barrier layer (e.g., Ti/TiN) and then tungsten. In an optional embodiment, metallization is performed by printing a conductive paste using an inkjet print head.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention relates to an improvement in photovoltaic devices produced substantially entirely using existing process flows. The following description is presented to enable one of ordinary skill in the art to make and use the invention as provided in the context of a particular application and its requirements. As used herein, directional terms such as "upper", "lower", "above", "below", are intended to provide relative positions for purposes of description, and are not intended to designate an absolute frame of reference. The terms "coupled" and "connected", which are utilized herein, are defined as follows. The term "connected" is used to describe a direct connection between two circuit elements, for example, by way of a metal line formed in accordance with normal integrated circuit fabrication techniques. In contrast, the term "coupled" is used to describe either a direct connection or an indirect connection between two circuit elements. For example, two coupled elements may be directly connected by way of a metal line, or indirectly connected by way of an intervening circuit element (e.g., a capacitor, resistor, inductor, or by way of the source/drain terminals of a transistor). Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
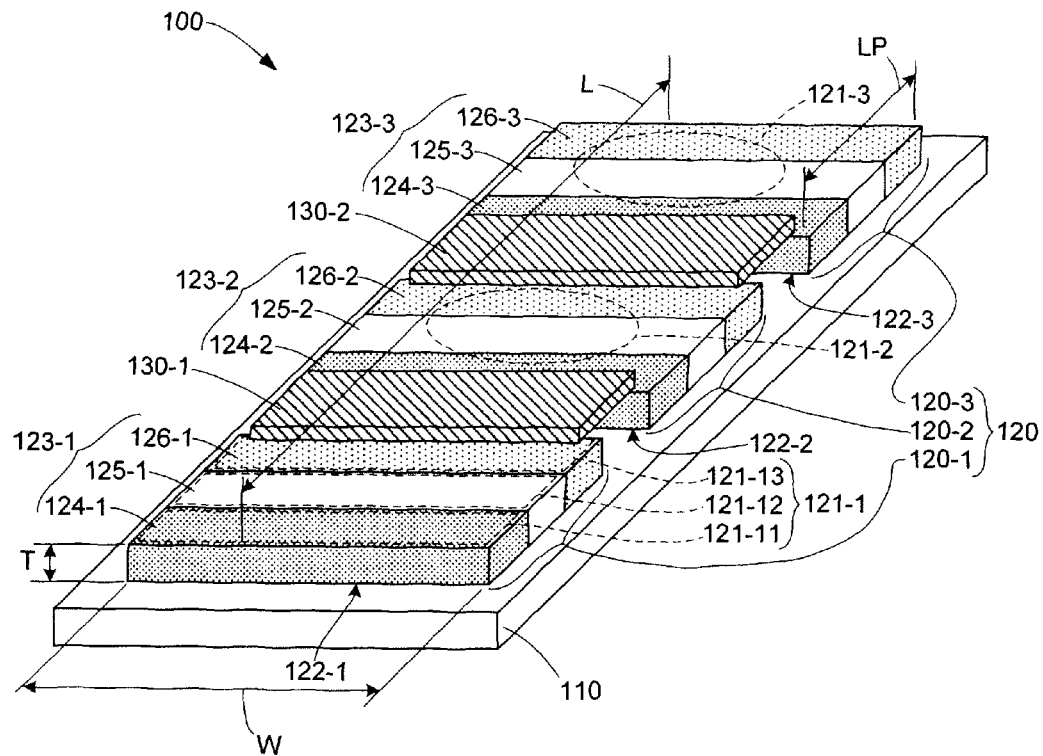
FIG. 1 is a top side perspective view showing a simplified photovoltaic device according to a generalized embodiment of the present invention.

FIG. 1 is perspective view showing a simplified photovoltaic device 100 according to a generalized embodiment of the present invention. Photo-voltaic device 100 generally includes an insulating layer 110 consisting entirely of an electrically insulating material (e.g., silicon nitride, silicon oxide, glass, ceramics, plastic, etc.), and a semiconductor layer 120 that is disposed entirely and directly on insulating layer 110.

According to an aspect of the present invention, semiconductor layer 120 is substantially rectangular in shape and has a longitudinal length L, a lateral width W and a thickness T. As explained below the longitudinal length L is generally determined by the number of lateral light-sensitive diodes implemented by device 100 required to obtain a requested voltage, where each diode has a practical length of 2-200 um. The lateral width W is determined solely by practical considerations related to targeted current. The thickness T of semiconductor layer 120 can vary significantly depending on the type of semiconductor material used and the applied production process, with a practical thickness T being in the range of 0.1 to 200 microns. In alternative embodiments, semiconductor layer 120 comprises monocrystalline silicon, amorphous silicon, polycrystalline silicon, silicon germanium, germanium, or gallium nitride.

According to the simplified embodiment shown in FIG. 1, semiconductor layer 120 includes three semiconductor layer portions 120-1, 120-2 and 120-3 that are sequentially arranged in the longitudinal direction, where each semiconductor layer portions (e.g., portion 120-3) extends the entire width W in the lateral direction, whereby semiconductor layer portions 120-1, 120-2 and 120-3 form parallel elongated (i.e., in the lateral direction) semiconductor structures. Note that three semiconductor layer portions are shown in FIG. 1 for descriptive purposes, and in practical applications the number of semiconductor layer portions is typically much larger than three. Each semiconductor layer portion 120-1, 120-2 and 120-3 has a substantially planar upper surface facing away from insulating layer 110, and a lower surface contacting the insulating layer 110. For example, semiconductor layer portion 120-1 has an upward-facing upper surface 121-1 and a lower surface 122-1 that contacts insulating layer 110. Similarly, semiconductor layer portion 120-2 has an upper surface 121-2 and a lower surface 122-2, and semiconductor layer portion 120-3 has an upper surface 121-3 and a lower surface 122-3.

As used herein, the phrase "semiconductor layer", unless further specified, is intended to refer both to a contiguous layer of semiconductor material including multiple semiconductor layer portions of the photovoltaic device (e.g., see the embodiment described below with reference to FIG. 3), and to a series of separated (spaced-apart) semiconductor layer portions that are formed during a single deposition step (e.g., see the "trench" embodiments described below with reference to the embodiments of FIGS. 8-17). Similarly, the phrase "semiconductor layer portion", unless further specified, is intended to refer both to a section of a contiguous layer of semiconductor material (e.g., as in the embodiment described below with reference to FIG. 3), or to multiple separated (spaced-apart) portions of semiconductor material (e.g., as described below with reference to the "trench" embodiments of FIGS. 8-17).

Note that the features depicted in the various figures are not drawn to scale in order to better illustrate the various device structures. For example, the thickness T of film is typically much smaller than all lateral dimensions of semiconductor layer 120.

According to another aspect of the present invention, each semiconductor layer portion 120-1, 120-2 and 120-3 comprises a lateral light-sensitive P-I-N diode formed by laterally-aligned and spaced-apart P+ and N+ doped regions in which the associated P+ and N+ dopant has diffused entirely through the respective semiconductor layer portion. For example, semiconductor layer portion 120-1 includes a lateral light-sensitive diode 123-1 formed by an elongated P+ doped region 124-1, an elongated N+ doped region 126-1, an elongated intrinsic region 125-1 that is disposed between P+ doped region 124-1 and N+ doped region 126-1. As depicted in FIG. 1, the P+ dopant is diffused entirely through semiconductor layer portion 121-1 in P+ doped region 124-1 (i.e., from an upper surface portion e.g., 121-11 of upper surface 121-1 to a corresponding portion of lower surface 122-1). Similarly, the N+ dopant is diffused entirely through N+ doped region 126-1 (i.e., from an upper surface portion e.g., 121-13 of upper surface 121-1 to a corresponding portion of lower surface 122-1), and intrinsic region 125-1 includes substantially undoped (native) semiconductor material extending from upper surface portion e.g., 121-12 to a corresponding portion of said lower surface 122-1. With this arrangement, elongated P+ doped region 124-1 is entirely separated from the elongated N+ doped region 126-1 by elongated intrinsic region 125-1, thereby forming the desired lateral P-I-N diode structure. Note also that elongated P+ doped region 124-1, elongated intrinsic region 125-1 and elongated N+ doped region 126-1 are elongated in the lateral (width) direction of semiconductor layer portion 120-1, and define substantially parallel rectangular upper surface portions 121-11, 121-12 and 121-13 on upper surface 121-1, with said upper surface portion 121-12 disposed between upper surface portions 121-11 and 121-13. Similarly, semiconductor layer portion 120-2 includes a lateral light-sensitive diode 123-2 formed by an elongated P+ doped region 124-2, an elongated intrinsic region 125-2, and an elongated N+ doped region 126-2 extending between upper surface portion 121-2 and lower surface portion 122-2, and semiconductor layer portion 120-3 includes a lateral light-sensitive diode 123-3 formed by an elongated P+ doped region 124-3, an elongated intrinsic region 125-3, and an elongated N+ doped region 126-3 extending between upper surface portion 121-3 and lower surface portion 122-3.

Figure 2:
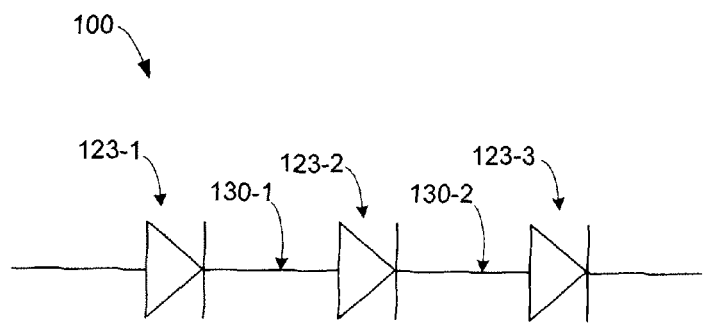
FIG. 2 is a circuit diagram depicting the effective circuit generated by the photovoltaic device of FIG. 1.

According to yet another aspect of the present invention an electrically conductive structure 130-1 is connected between elongated N+ doped region 126-1 of lateral light-sensitive diode 123-1 and elongated P+ doped region 124-2 of lateral light-sensitive diode 123-2, and an electrically conductive structure 130-2 is connected between elongated N+ doped region 126-2 of lateral light-sensitive diode 123-2 and elongated P+ doped region 124-3 of lateral light-sensitive diode 123-3. Electrically conductive structures 130-1 and 130-2 are preferably metal film structures that are elongated in the lateral direction and have just enough length in the longitudinal direction to operably contact a portion of each associated doped region such that electrically conductive structure 130-1 forms a low resistance electrically conductive path between lateral light-sensitive diodes 123-1 and 123-2, and electrically conductive structure 130-2 forms a low resistance electrically conductive path between lateral light-sensitive P-I-N diodes 123-2 and 123-3. FIG. 2 is a circuit diagram depicting the effective circuit generated by the photovoltaic device 100 of FIG. 1, wherein lateral light-sensitive diodes 123-1, 123-2 and 123-3 are connected in series by low resistance electrically conductive structures 130-1 and 130-2.

Photovoltaic device 100 provides an advantage over conventional photovoltaic devices in that the associated fabrication processes needed to produce the various structures of photovoltaic device 100 can be easily integrated into standard process flows (e.g., established CMOS process flows, power management (PV) CMOS process flows, and microelectromechanical system (MEMS) process flows) without requiring any (or requiring very few) additional masks. For example, the above-described arrangement of semiconductor layer 120 on insulating layer 110 is easily implemented using known standard shallow trench isolation (STI), wherein a polycrystalline silicon layer has a thickness T in the range of 0.1 um to 0.5 um is typically formed on a layer of silicon nitride. Alternatively, the semiconductor layer 120 on insulating layer 110 arrangement is implemented during using well-known silicon-on-insulator (SOI) processes in which a monocrystalline silicon having a thickness T in the range of 0.1 um to 4 um is typically formed on barrier oxide (BOX). Those skilled in the art will recognize that STI and SOI techniques are often incorporated into standard process technologies that further support the patterned doping process associated with the formation of lateral light-sensitive diodes 123-1, 123-2 and 123-3, and metallization processes (e.g., silicide, aluminum and/or titanium film generation) associated with the formation of electrically conductive structures 130-1 and 130-2. Thus, the novel structural arrangement of photovoltaic device 100 is easily integrated into standard process flows using existing (or only slightly modified) process steps.

Figure 18:
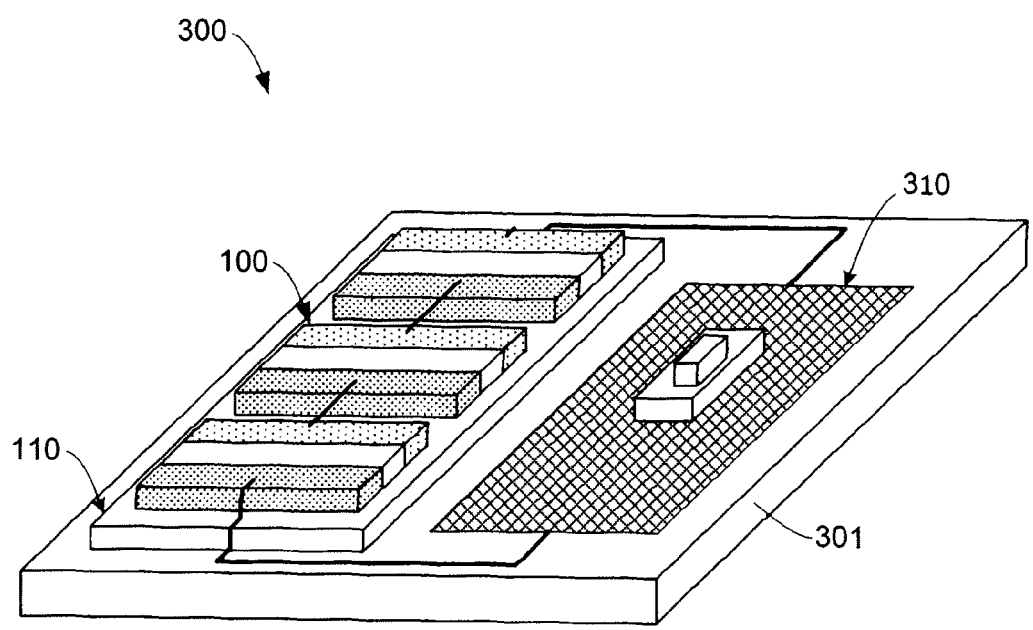
FIG. 18 is a top side perspective view showing a simplified CMOS IC device including an embedded photovoltaic device according to another specific embodiment of the present invention.

By forming photovoltaic device 100 using existing (or only slightly modified) process flows, the present invention facilitates the use of photovoltaic device 100 to form low-cost embedded photoelectric arrays on IC devices formed by these standard process technologies. For example, referring briefly to FIG. 18, a simplified CMOS IC 300 is shown that includes both photovoltaic device 100 and a generic CMOS circuit 310 (e.g., a PM, MEMS, RFID or other mixed signal/RFCMOS device) that are entirely formed on a monocrystalline silicon substrate using a standard CMOS process flow. In this example, insulating layer 110 is formed on substrate 301 using the techniques described herein, and photovoltaic device 100 is connected to supply power to CMOS circuit 310 by way of metal lines formed in accordance with the techniques described herein.

Alternatively, the disclosed photovoltaic device 100 can be produced on low-cost SOI substrates (e.g., crystalline, or high quality thick polycrystalline silicon films on glass or other types of isolators) to provide, for example, low-cost, high voltage solar arrays for medium-level (i.e., from several to tens of suns) solar energy concentrators. In these embodiments, patterned conductive structures 130-1 and 130-2 are easily formed using available or otherwise low-cost metallization processes (e.g., low-cost aluminum films or inkjet-printed conductive paste).

Additional features and aspects of the present invention will now be described with reference to exemplary specific embodiments.

Figure 3:
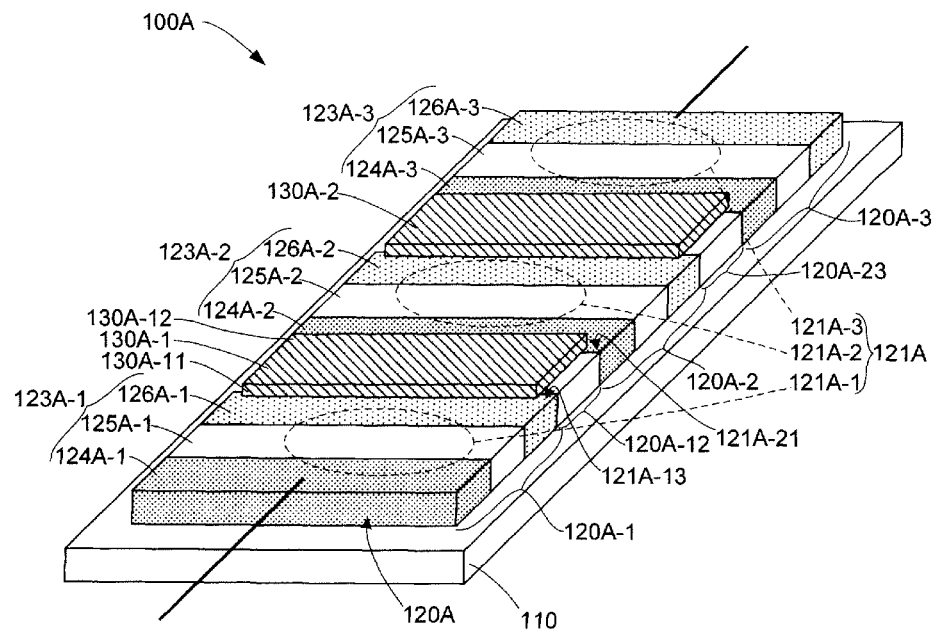
FIG. 3 is a top side perspective view showing a simplified photovoltaic device according to a "flat surface" embodiment of the present invention.
Figure 4:
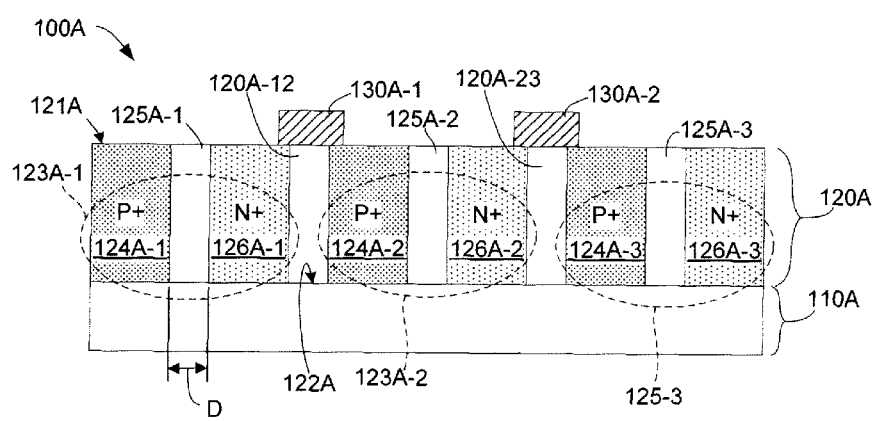
FIG. 4 is a cross-sectional side view showing the photovoltaic device of FIG. 3 in additional detail.

FIGS. 3 and 4 are perspective and cross-sectional side views showing a simplified photovoltaic device 100A according to a "flat surface" embodiment of the present invention. Similar to the generalized embodiment described above with reference to FIG. 1, photovoltaic device 100A generally includes an insulating layer 110A, a semiconductor layer 120A that is disposed on insulating layer 110A, and electrically conductive structures 130A-1 and 130A-2. Semiconductor layer 120A includes three semiconductor layer portions 120A-1, 120A-2 and 120A-3, where each portion includes doped diffusions forming an associated lateral light-sensitive P-I-N diode formed by laterally-aligned and spaced-apart P+ and N+ doped regions that are diffused entirely through the semiconductor material (e.g., semiconductor layer portion 120A-1 includes a lateral light-sensitive diode 123A-1 formed by an elongated P+ doped region 124A-1, an elongated intrinsic region 125A-1, and an elongated N+ doped region 126A-1, semiconductor layer portion 120A-2 includes a lateral light-sensitive diode 123A-2 formed by an elongated P+ doped region 124A-2, an elongated intrinsic region 125A-2, and an elongated N+ doped region 126A-2, and semiconductor layer portion 120A-3 includes a lateral light-sensitive diode 123A-3 formed by an elongated P+ doped region 124A-3, an elongated intrinsic region 125A-3, and an elongated N+ doped region 126A-3). Electrically conductive structures 130A-1 and 130A-2 are respectively connected between associated diode pairs 123A-1/123A-2 and 123A-2/123A-3.

Photovoltaic device 100A differs from the generalized embodiment in that semiconductor layer portions 120A-1, 120A-2 and 120A-3 are sequentially arranged sections of contiguous (i.e., connected in an unbroken sequence extending in the longitudinal direction) semiconductor layer structure 120A that also includes intervening intrinsic portions integrally connecting adjacent pairs of the sequentially arranged sections. Specifically, semiconductor layer portion 120A-1 is connected to adjacent semiconductor layer portion 120A-2 by an intervening intrinsic portion 120A-12, and semiconductor layer portion 120A-2 is connected to adjacent semiconductor layer portion 120A-3 by an intervening intrinsic portion 120A-23. The resulting "flat surface" structure has a continuous, planar upper surface 121A formed by upper surface portions 121A-1, 121A-2 and 121A-3 of semiconductor layer portions 120A-1 120A-2 and 120A-3, and also by surface portions of intervening intrinsic portions 120A-12 and 120A-23.

According to an aspect of the present embodiment, the unbroken, flat upper surface 121A of semiconductor layer structure 120A serves as a convenient bridge (platform) for forming electrically conductive structures 130A-1 and 130A-2 using standard metallization techniques. That is, electrically conductive structures 130A-1 and 130A-2 are respectively patterned on intervening intrinsic portions 120A-12 and 120A-23 such that small portions of the conductive material extend onto the upper surface portions of the adjacent semiconductor layer portions 120A-1, 120A-2 and 120A-3 to provide the necessary electrical connections described above. For example, a first portion 130A-11 of electrically conductive structure 130A-1 extends from a first end of intervening intrinsic portions 120A-12 and is disposed on upper surface portion 121A-13 of semiconductor layer portion 120A-1, and a second portion 130A-12 of electrically conductive structure 130A-1 extends from an opposing second end of intervening intrinsic portions 120A-12 and is disposed on upper surface portion 121A-21 of semiconductor layer portion 120A-2, thereby providing the necessary electrical connection between N+ doped region 126A-1 and P+ doped region 124A-2.

According to a practical embodiment of the present invention, insulating layer 110A is silicon dioxide, contiguous semiconductor layer structure 120A is a layer of polycrystalline silicon formed on the silicon dioxide, and electrically conductive structures 130A-1 and 130A-2 are strips of silicide. This combination is particularly suited to incorporation into standard CMOS process flow including STI because the polycrystalline silicon on silicon dioxide is part of a standard CMOS STI process, as is the subsequent formation of silicide on the polycrystalline silicon, thereby allowing formation of photovoltaic device 100A without any (or with very few) additional processing steps or masks other than those used in the core standard CMOS STI process.

Figure 5:
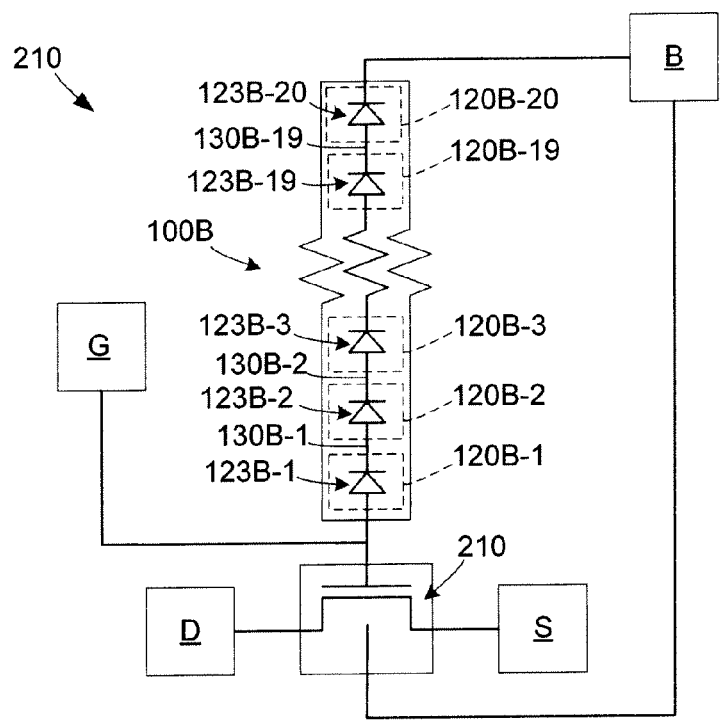
FIG. 5 is a simplified diagram showing an exemplary test circuit including a photovoltaic device according to an exemplary practical embodiment of the present invention.

FIG. 5 is a simplified diagram showing an exemplary test circuit 200 including a photovoltaic array (device) 100B and associated test circuitry according to an exemplary practical embodiment of the present invention. Photovoltaic device 100E includes twenty serially connected semiconductor layer portions 120B-1 to 1208-20 upon which are respectively formed twenty lateral light-sensitive diodes 123B-1 to 123B-20 that are connected in series by said plurality of electrically conductive structures e.g., 130B-1 to 130B-19 in accordance with the features described herein. In the practical embodiment, the twenty lateral P-I-N light-sensitive diodes 123B-1 to 123B-20 were formed on an isolated polycrystalline silicon pad and used to control a MOS transistor 210 in response to the applied light. The layout of the photovoltaic array is depicted in FIG. 5, with contact pads B, D, S and G being connected by conductive lines (wires) between photovoltaic array 100B and NMOS transistor 210 as indicated. Note that the edges of photovoltaic array 100B are defined by a poly etch to provide suitable isolation.

Figure 6:
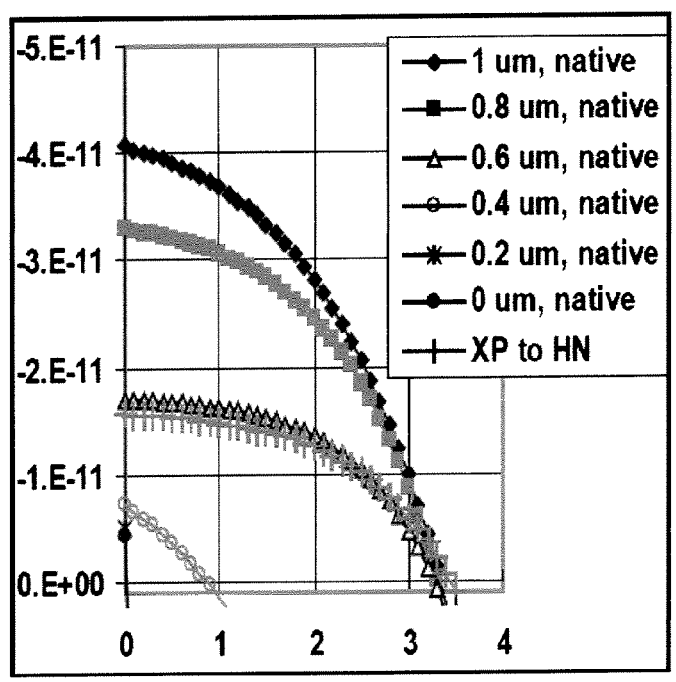
FIG. 6 is a graph showing experimental data obtained from multiple test circuits similar to those shown in FIG. 5 for photovoltaic devices having various sizes.

A series of feasibility experiments were performed by the present inventors using various numerous test circuit based on the layout of test circuit 200 (FIG. 5), where the photovoltaic array of each test circuit was varied to determine optimal operating conditions. The high voltages generated by the various photovoltaic arrays 100B was applied, in particular, to the gate of NMOS transistor 210 (see FIG. 5), which allowed switching the drain current by switching off and on the light source, and the loading curve shown in FIG. 6 was generated for the various photovoltaic arrays. In one specific embodiment, the thickness of the polysilicon layer is approximately 0.25 um, and the N+ and P+ implants are on the order of $2*10^{15}$ cm$^{-2}$ to $3*10^{15}$ cm$^{-2}$ using As and BF$_2$ ions, respectively. The various curves of FIG. 6 show different spaces D (see FIG. 4) between the P+ doping region and the N+ doping region of the P-I-N light-sensitive diodes, which was varied in the range of 0 to 1 um. The graph also includes a split where NLDD implant (also As, $3*10^{14}$ cm$^{-2}$) was used instead of N+.

FIGS. 7-10 show a simplified photovoltaic device 100C according to a "bypass diode" embodiment of the present invention.

Figure 7:
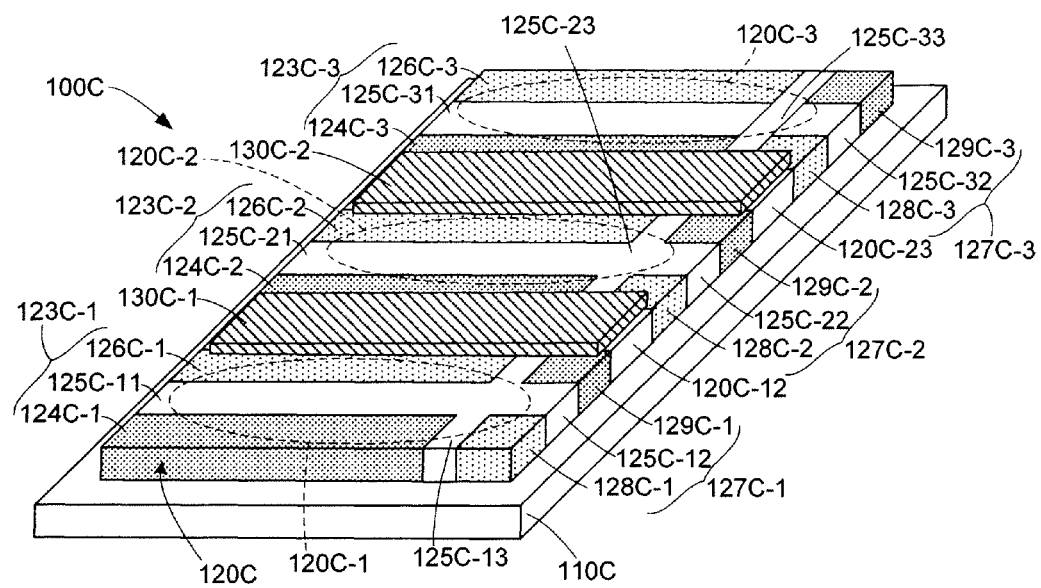
FIG. 7 is a top side perspective view showing a simplified photovoltaic device including bypass diodes according to another specific embodiment of the present invention.

Referring to FIG. 7, similar to the generalized embodiment described above with reference to FIGS. 1 and 3, photovoltaic device 100C generally includes an insulating layer 110C, a semiconductor layer 120C that is disposed on insulating layer 110C, and electrically conductive structures 130C-1 and 130C-2. Semiconductor layer 120C includes three semiconductor layer portions 120C-1, 120C-2 and 120C-3, where each portion includes doped diffusions forming an associated lateral light-sensitive P-I-N diode formed by laterally-aligned and spaced-apart P+ and N+ doped regions that are diffused entirely through the semiconductor material (e.g., semiconductor layer portion 120C-1 includes a lateral light-sensitive diode 123C-1 formed by an elongated P+ doped region 124C-1, an elongated intrinsic region 125C-11 and an elongated N+ doped region 126C-1, semiconductor layer portion 120C-2 includes a lateral light-sensitive diode 123C-2 formed by an elongated P+ doped region 124C-2, an elongated intrinsic region 125C-21 and an elongated N+ doped region 126C-2, and semiconductor layer portion 120C-3 includes a lateral light-sensitive diode 123C-3 formed by an elongated P+ doped region 124C-3, an elongated intrinsic region 125C-31 and an elongated N+ doped region 126A-3). Electrically conductive structures 130C-1 and 130C-2 are respectively connected between associated diode pairs 123C-1/123C-2 and 123C-2/123C-3. In addition, similar to the "flat surface" embodiment described above with reference to FIG. 3, semiconductor layer portions 120C-1, 120C-2 and 120C-3 are sequentially arranged sections of contiguous (i.e., connected in an unbroken sequence extending in the longitudinal direction) semiconductor layer structure 120C that also includes intervening intrinsic portions 120C-12 and 120C-23 respectively connecting adjacent pairs of the sequentially arranged sections.

Figure 8:
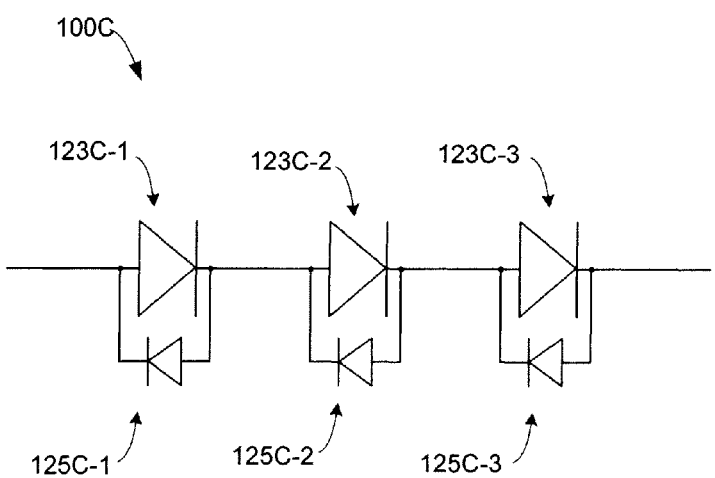
FIG. 8 is a circuit diagram depicting the effective circuit generated by the photovoltaic device of FIG. 7.

As indicated by the simplified circuit diagram of FIG. 8, photovoltaic device 100C differs from the previously described embodiments in that it further includes bypass diodes 127C-1, 127C-2 and 127C-3 respectively connected in parallel with and arranged opposite in polarity with lateral light-sensitive diodes 123C-1, 123C-2 and 123C-3. In the normal operation mode, small bypass diodes 127C-1, 127C-2 and 127C-3 are reverse biased and thus practically do not influence the operation of photovoltaic device 100C. In case one of the serially connected photodiodes 123C-1, 123C-2 and 123C-3 fails (i.e., does not generate photovoltage), the whole voltage of the serially connected arrangement drops on the damaged diode (if the load resistance is lower than the failed diode resistance). This creates a "hot spot" that may destroy the array. Bypass diodes 127C-1, 127C-2 and 127C-3 solve this problem by maintaining low resistance across any malfunctioning photodiode.

According to the disclosed embodiment, bypass diode 127C-1, 127C-2 and 127C-3 are implemented by spaced-apart N+ and P+ diffusions respectively disposed in corresponding semiconductor layer portions 120C-1, 120C-2 and 120C-3, where the spaced-apart N+ and P+ diffusions are aligned with and spaced from corresponding ends of the P+ and N+ doped regions of lateral light-sensitive diodes 123C-1, 123C-2 and 123C-3. For example, bypass diode 127C-1 includes an N+ diffusion 128C-1 and a P+ diffusion 129C-1 that are formed in semiconductor layer portion 120C-1, with N+ diffusion 128C-1 being aligned with and spaced from an end of elongated P+ doped region 124C-1, and with P+ diffusion 129C-1 being aligned with and spaced from an end of elongated N+ doped region 126C-1. Note that N+ diffusion 128C-1 is separated from P+ diffusion 129C-1 by an intrinsic region 125C-12, and N+ diffusion 128C-1 and P+ diffusion 129C-1 are separated from elongated P+ doped region 124C-1 and N+ doped region 126C-1 by a longitudinally aligned intrinsic region 125C-13. Similarly, bypass diode 127C-2 includes an N+ diffusion 128C-2 and a P+ diffusion 129C-2 that are formed in semiconductor layer portion 120C-2 and separated by an intrinsic region 125C-22, with N+ diffusion 128C-2 being aligned with and separated by intrinsic region 125C-23 from an end of elongated P+ doped region 124C-2, and with P+ diffusion 129C-1 being aligned with and separated by intrinsic region 125C-23 from an end of elongated N+ doped region 126C-2, and bypass diode 127C-3 includes an N+ diffusion 128C-3 and a P+ diffusion 129C-3 that are formed in semiconductor layer portion 120C-3 and separated by an intrinsic region 125C-32, with N+ diffusion 128C-3 being aligned with and separated by intrinsic region 125C-33 from an end of elongated P+ doped region 124C-3, and with P+ diffusion 129C-3 being aligned with and separated by intrinsic region 125C-33 from an end of elongated N+ doped region 126C-3. This arrangement simplifies the fabrication process because the proper parallel connection of the bypass diodes is achieved simply by extending electrically conductive structures 130C-1 and 130C-2 such that they also connect the respective P+ and N+ diffusions of adjacent bypass diodes (i.e., electrically conductive structure 130C-1 is extended to connect P+ diffusion 129C-1 of bypass diode 127C-1 with N+ diffusion 128C-2 of bypass diode 127C-2, and electrically conductive structure 130C-2 is extended to connect P+ diffusion 129C-2 of bypass diode 127C-2 with N+ diffusion 128C-3 of bypass diode 127C-3).

According to another specific embodiment of the present invention, photovoltaic devices 100C is fabricated by forming crystalline silicon layer 120C on a BOX layer 110C using standard SOI techniques, forming lateral light-sensitive diodes 123C-1 to 123C-3 and bypass diodes 127C-1 to 127C-3 by diffusing P+ and N+ dopant into spaced-apart regions of portions 120C-1 to 120C-3, and then using metallization techniques of the core process flow to produce electrically conductive (metal film) structures 130C-1 and 130C-2 to connect the various diodes in the series/parallel arrangement described above. In an exemplary production method, the fabrication flow begins by utilizing existing cutting or trenching processes to define the outer peripheral edges of SOI silicon layer 120C, such isolation operations being standard in MEMS and PM processes and are typically used for electrical isolation. N+ and P+ implants are done through special (non-critical) masks, and followed by a drive with high thermal budget to move the diffusion profiles to the silicon-BOX interface (i.e., through the entire thickness of silicon layer 120C). For thin SOI (up to 0.5 um silicon thickness) standard source/drain implants can be used. Standard metallization is then used to form metal film structures 130C-1 and 130C-2 and other related metal structures such as contact pads.

Figure 9:
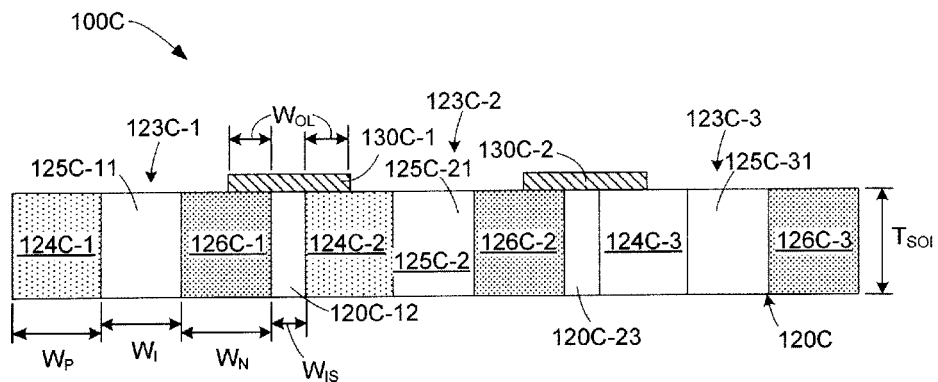
FIG. 9 is a simplified side elevation view showing the photovoltaic device of FIG. 7 in additional detail.
Figure 10:
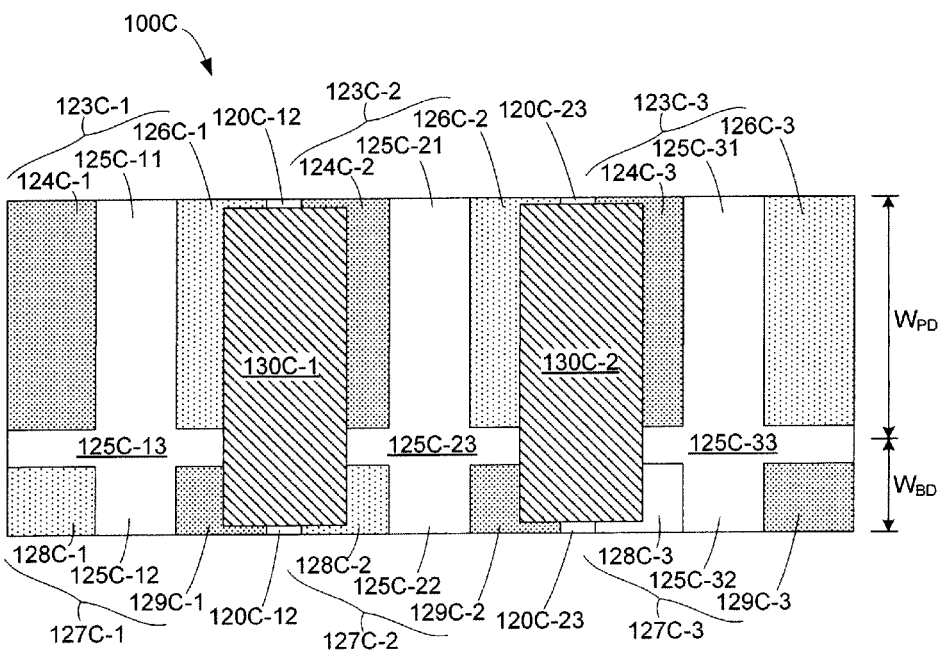
FIG. 10 is a simplified top plan view showing the photovoltaic device of FIG. 7 in additional detail.

FIGS. 9 and 10 are cross-sectional side and top plan views showing a portion of photovoltaic device 100C in additional detail. In accordance with the exemplary embodiment (which is not intended to be limiting), lateral light-sensitive diodes 123C-1 to 123C-3 and bypass diodes 127C-1 to 127C-3 are formed on a 4 um thick crystalline SOI layer 120C (i.e., $T_{SOI}=4$ microns), with the widths $W_P$ of P+ doped region 124C-1, 124C-2 and 124C-3 and P+ diffusions 129C-1, 129C-2 and 129C-3 being in the range of 2 um to 5 um, the widths $W_N$ of N+ doped region 126C-1, 126C-2 and 126C-3 and N+ diffusions 128C-1, 128C-2 and 128C-3 being in the range of 2 um to 5 um, and the widths $W_I$ of intrinsic regions 125C-11, 125C-12, 125C-21, 125C-22, 125C-31 and 125C-32 being in the range of 20 um to 50 um. The width $W_{IS}$ of intrinsic regions under silicidation 120C-12 and 120C-23 and the longitudinal intrinsic regions 125C-13, 125C-23 and 125C-33 (see FIG. 10) is equal to or more than $W_N$ and $W_P$. The overlap width $W_{OL}$ of metal film 130C-1 over the associated P+ and N+ diffusions is equal to or less than one-half of the diffusion widths $W_N$ and $W_P$. Referring to FIG. 10, each bypass diode (e.g., bypass diode 127C-1) has a lateral width $W_{BD}$ that is approximately $1/10^{th}$ or less of the lateral width $W_{PD}$ of its associated lateral light-sensitive diodes (e.g., lateral light-sensitive diode 123C-1). In the exemplary embodiment, lateral width $W_{ED}$ of the bypass diodes is in the range of 5 um to 10 um, and lateral width $W_{PD}$ of the light-sensitive diodes is in the range of 50 um to 100 um.

For higher light conversion efficiency, thicker silicon layers are advantageous. "Trench" embodiments that utilize the features and benefits of the present invention but are better suited for silicon layers having a thickness on the order of 10 um to 50 um are described below with reference to FIGS. 11-17.

Figure 11:
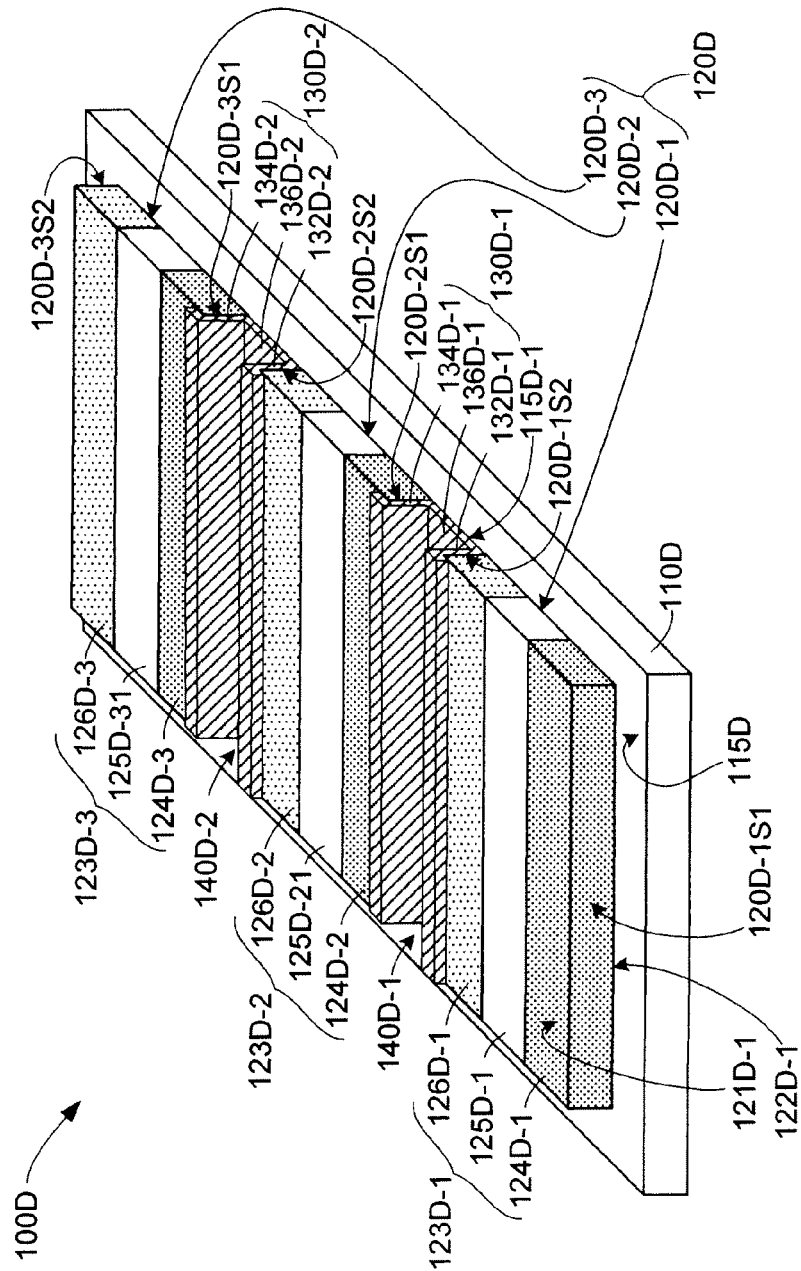
FIG. 11 is a top side perspective view showing a simplified photovoltaic device including isolation trenches according to another specific embodiment of the present invention.
Figure 12:
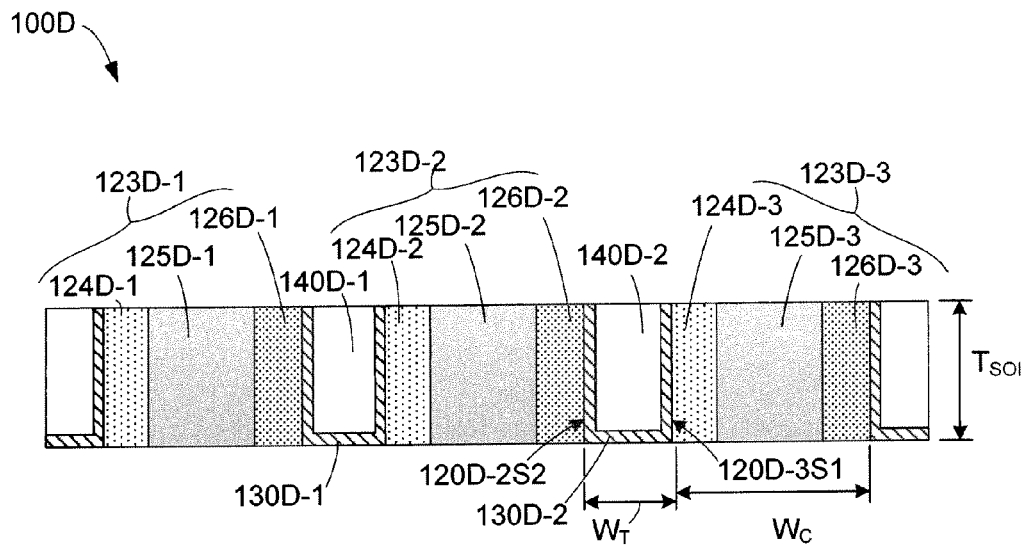
FIG. 12 is a simplified cross-sectional side elevation view showing the photovoltaic device of FIG. 10 in additional detail.
Figure 13:
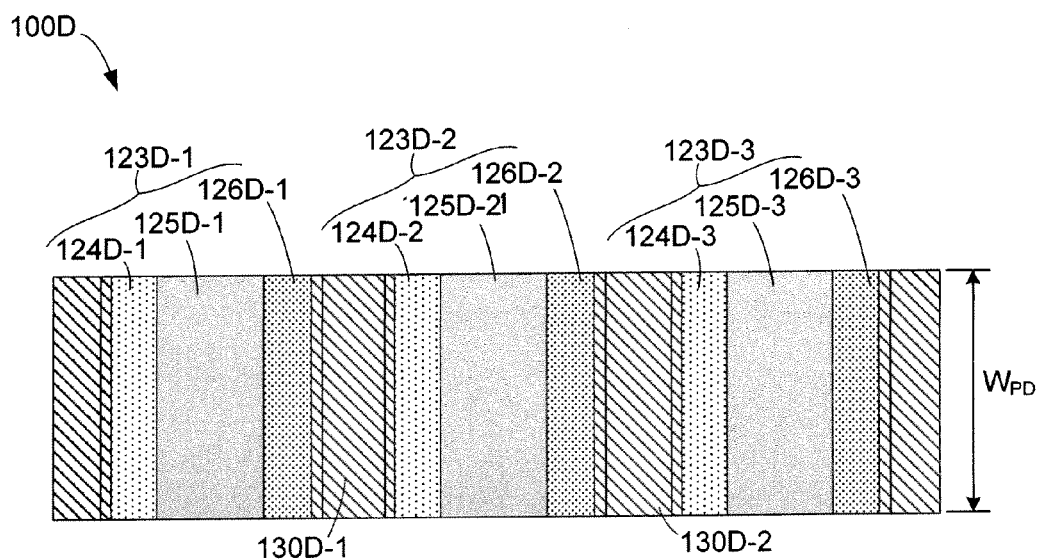
FIG. 13 is a simplified top plan view showing the photovoltaic device of FIG. 10 in additional detail.

FIGS. 11-13 show a simplified photovoltaic device 100D according to an exemplary "trench" embodiment of the present invention. Referring to FIG. 11, similar to the generalized embodiment described above with reference to FIG. 1, photovoltaic device 100D generally includes an insulating layer 110D, a semiconductor layer 120D that is disposed on insulating layer 110D, and electrically conductive structures 130D-1 and 130D-2. Semiconductor layer 120D includes three semiconductor layer portions 120D-1, 120D-2 and 120D-3, where each portion includes doped diffusions forming an associated lateral light-sensitive P-I-N diode formed by laterally-aligned and spaced-apart P+ and N+ doped regions that are diffused entirely through the semiconductor material (e.g., semiconductor layer portion 120D-1 includes a lateral light-sensitive diode 123D-1 formed by an elongated P+ doped region 124D-1, an elongated intrinsic region 125D-1 and an elongated N+ doped region 126D-1, semiconductor layer portion 120D-2 includes a lateral light-sensitive diode 123D-2 formed by an elongated P+ doped region 124D-2, an elongated intrinsic region 125D-2, and an elongated N+ doped region 126D-2, and semiconductor layer portion 120D-3 includes a lateral light-sensitive diode 123D-3 formed by an elongated P+ doped region 124D-3, an elongated intrinsic region 125D-3 and an elongated N+ doped region 126D-3). In addition, electrically conductive structures 130D-1 and 130D-2 are respectively connected between associated diode pairs 123D-1/123D-2 and 123D-2/123D-3.

According to an aspect of the present embodiment, photovoltaic device 100D differs from the previously described embodiments in that semiconductor layer 120D is trenched (etched) or otherwise separated into three sequentially arranged portions 120D-1, 120D-2 and 120D-3 with a trench 140D-1 defined between adjacent semiconductor layer portions 120D-1 and 120D-2, and a trench 140D-2 defined between adjacent semiconductor layer portions 120D-2 and 120D-3. In particular, each semiconductor layer portion 120D-1, 120D-2 and 120D-3 includes a side wall aligned in the lateral direction and facing in the longitudinal direction that defines an outer extent of an associated P+/N+ doped region. For example, elongated P+ doped region 124D-1 includes a corresponding side wall 124D-1S1 of semiconductor layer portion 120D-1, and N+ doped region 126D-1 includes a corresponding side wall 124D-1S2 of semiconductor layer portion 120D-1. Similarly, elongated P+ doped region 124D-2 includes a side wall 124D-2S1 and N+ doped region 126D-2 includes a side wall 124D-2S2, and elongated P+ doped region 124D-3 includes a side wall 124D-3S1 and N+ doped region 126D-3 includes a side wall 124D-3S2. Note that side walls 124D-1S1 and 124D-1S2 extend entirely through the semiconductor material forming layer 120D from upper surface 121D-1 of semiconductor layer portion 120D-1 to lower surface 122D-1 of semiconductor layer portion 120D-1 such that trench 140D-1 entirely separates adjacent semiconductor layer portions 120D-1 and 120D-2. Side walls 124D-2S1, 124D-2S2, 124D-3S1 and 124D-3S2 similarly extend the entire thickness of semiconductor layer portions 120D-2 and 120D-3 such trench 140D-2 entirely separates adjacent semiconductor layer portions 120D-2 and 120D-3. The processes used to form trenches 140D-1 and 140D-2 are typically included in the STI or SOI processes for electrically isolating the polysilicon or silicon layers.

According to another aspect of the present embodiment, photovoltaic device 100D differs from the previously described embodiments in that each electrically conductive structure 130D-1 and 130D-2 includes portions formed on opposing side walls of the adjacent semiconductor layer portions and on a surface of the insulating layer 110D separating the adjacent semiconductor layer portions. For example, electrically conductive structure 130D-1 includes a first vertically aligned portion 132D-1 formed on side wall 120D-1S2 of semiconductor layer portion 120D-1, a second vertically aligned portion 134D-1 formed on side wall 120D-2S1 of semiconductor layer portion 120D-2, and a third horizontally aligned portion 136D-1 disposed on a portion 115D-1 of upper surface 115D of insulating layer 110D, which is located between side walls 120D-1S2 and 120D-2S1. Similarly, electrically conductive structure 130D-2 includes a first vertically aligned portion 132D-2 formed on side wall 120D-2S2 of semiconductor layer portion 120D-2, a second vertically aligned portion 134D-2 formed on side wall 120D-3S1 of semiconductor layer portion 120D-3, and a third horizontally aligned portion 136D-2 disposed on a portion of upper surface 115D located between side walls 120D-2S2 and 120D-3S1. In case metals 130D-1 and 130D-2 are placed directly at the surface of Silicon in the trench, surface recombination effects are significant. To decrease the recombination, an approach known as PERL (passivated emitter and rear local back surface field) is used at the surfaces of trenches. In an optional embodiment, a thin passivation layer (e.g., $SiO_2$) is disposed on side walls 120D-1S2, 120D-2S1, 120D-2S2 and 120D-3S1 prior to formation of electrically conductive structures 130D-1 and 130D-2 in order to minimize recombination effects.

FIGS. 12 and 13 are cross-sectional side and top plan views showing a portion of photovoltaic device 100D in additional detail. Referring to FIG. 12, according to the exemplary embodiment, lateral light-sensitive diodes 123D-1 to 123D-3 are formed on a thick crystalline SOI layer 120D (e.g., $T_{SOI}$=40 to 50 microns), the widths $W_C$ of the light colleting region of each light-sensitive diode 123D-1 to 123D-3 was 100 um and a width $W_T$ of each trench 140D-1 and 140D-2 (between opposing side walls 120D-2S2 and 120D-3S1) is in the range of 20 um to 40 um. Referring to FIG. 13, each lateral light-sensitive diode 123D-1, 123D-2 and 123D-3 has a lateral width $W_{PD}$ in the range of 50 um to 100 um.

The "trench" type photovoltaic devices of the present invention are produced using any of the alternative fabrication methods described below.

An "implant first" fabrication method of forming trench type photovoltaic devices is similar to the methods described above with reference to the "flat surface" embodiments, and involves forming N+ and P+ doped regions before trench formation by implanting N+ and P+ dopants with a space between them at least twice the height of semiconductor layer thickness $T_{SOI}$, as described in the embodiments above (two special masks are needed before the trench etch in this case). A drive was performed at high temperature to form lateral p-n junctions. Feasibility experiments were performed by the inventors in which devices formed on 20 um Si were baked at 1350° C. for several hours, and the inventors confirmed the dopants reached the BOX interface. The CMOS/MEMS process was then continued after the drive. Trench etch was performed through the whole Si layer thickness down to the BOX. The surfaces of trenches were oxidized to suppress recombination effects, and then metallization was performed to connect the adjacent diodes.

Figure 14:
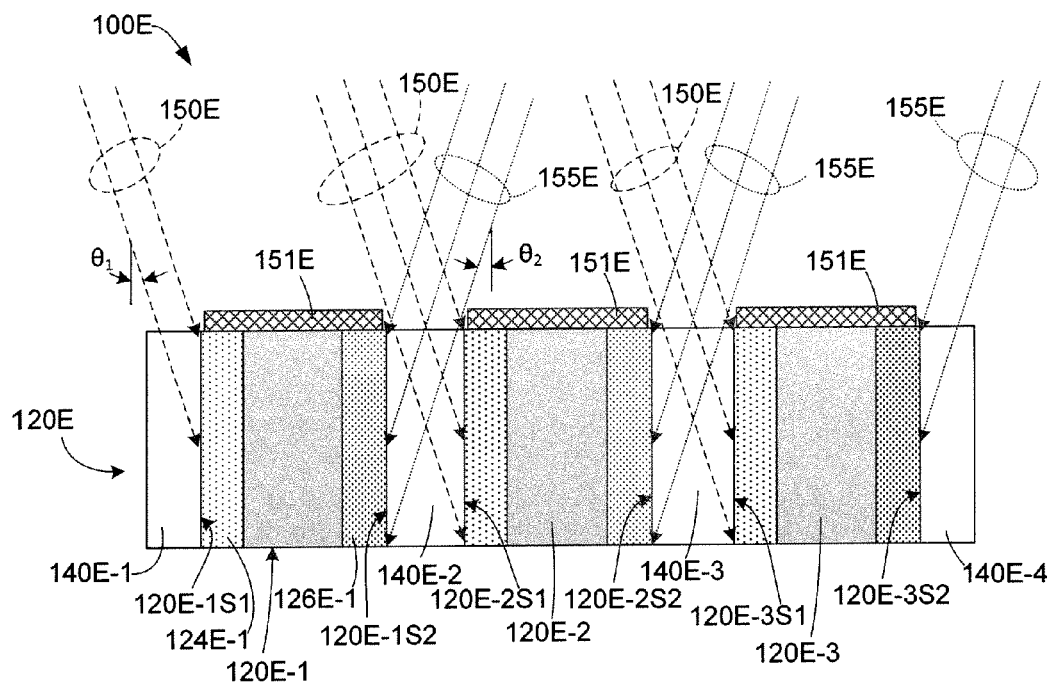
FIG. 14 is a simplified cross-sectional side elevation view depicting an implant process utilized to produce photovoltaic devices according to another specific embodiment of the present invention.

FIG. 14 depicts a "implant last" fabrication method of forming trench type photovoltaic device 110E according to another specific embodiment of the present invention. In this approach, P+ and N+ dopants are respectively applied onto the silicon using directional implants processes such that the P+ dopant enters side wall surfaces facing in a first direction, and the N+ dopant enters side wall surfaces facing in the opposite direction. In particular, as shown in FIG. 14, P+ dopant 150E is directed at a tilt angle θ₁ into trenches 140E-1 to 140E-3 such that P+ dopant 150E (e.g., boron or BF₂) is directed only onto and implanted only into side walls 120E-1S1, 120E-2S1, 120E-3S1 of semiconductor layer portions 120E-1 120E-2 and 120E-3, respectively, and N+ dopant 155E is directed at a tilt angle θ₂ into trenches 140E-2 to 140E-4 such that N+ dopant 155E (e.g., arsenic or phosphorous) is directed only onto and implanted only into side walls 120E-1S2, 120E-2S2, 120E-3S2 of semiconductor layer portions 120E-1 120E-2 and 120E-3, respectively. Tilt angles θ₁ and θ₂ are defined by the trench aspect ratio, which is in the range of ½ to ¹/₁₀, and directed in opposite directions such that the opposite walls are shaded during implantation (e.g., during the directional P+ implant, side walls 120E-1S2, 120E-2S2, 120E-3S2 are "shaded" by semiconductor layer portions 120E-1 120E-2 and 120E-3). In this case, CMOS/MEMS processes are first completed, then the trench etch is performed, and then the P+ and N+ is performed as indicated. The two special implants are performed while resist structures 151E, which employed for deep trench etch, are still located on semiconductor layer portions 120E-1 120E-2 and 120E-3. With this arrangement, only the leftward-facing and rightward-facing side walls of semiconductor layer portions 120E-1 120E-2 and 120E-3 are doped.

In both the "implant first" and "implant last" fabrication methods, passivation of the trench surfaces is preferred. The surface of each trench has a high density of traps, thus decreasing the efficiency of photovoltaic conversion due to surface recombination. To reduce the number of traps, it is desirable to contact the P+ and N+ doped regions only in small areas while keeping the majority of the trench surface under a layer of silicon oxide or silicon nitride. This same principle is used in passivated emitter, rear locally-diffused (PERL) solar cells, described, e.g., in Zhao J. et. al., Appl. Phys. Lett., vol. 66, pp. 3636-3638 (1995).

Figure 15:
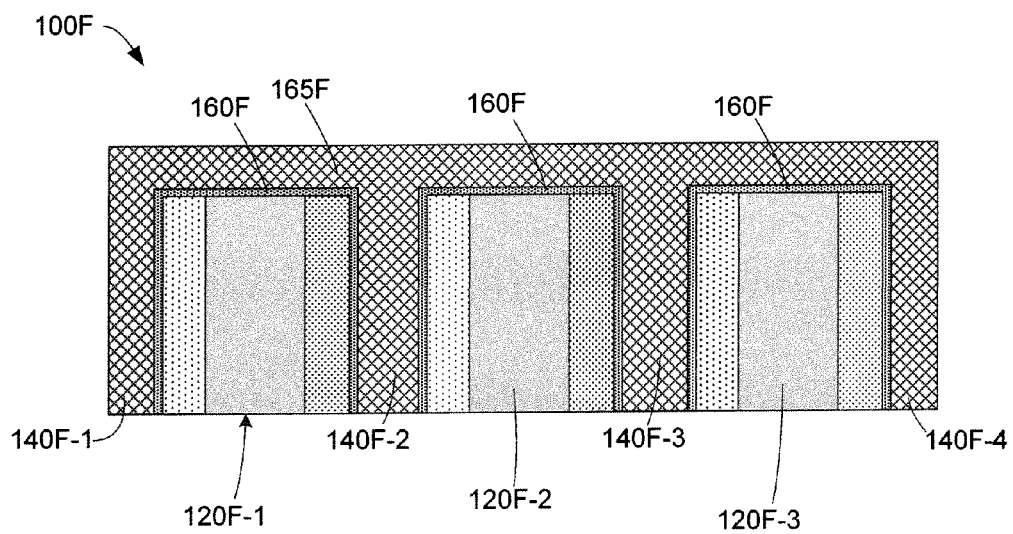
FIG. 15 is a simplified cross-sectional side elevation view depicting a trench filling process utilized to produce photovoltaic devices according to another specific embodiment of the present invention.
Figure 16:
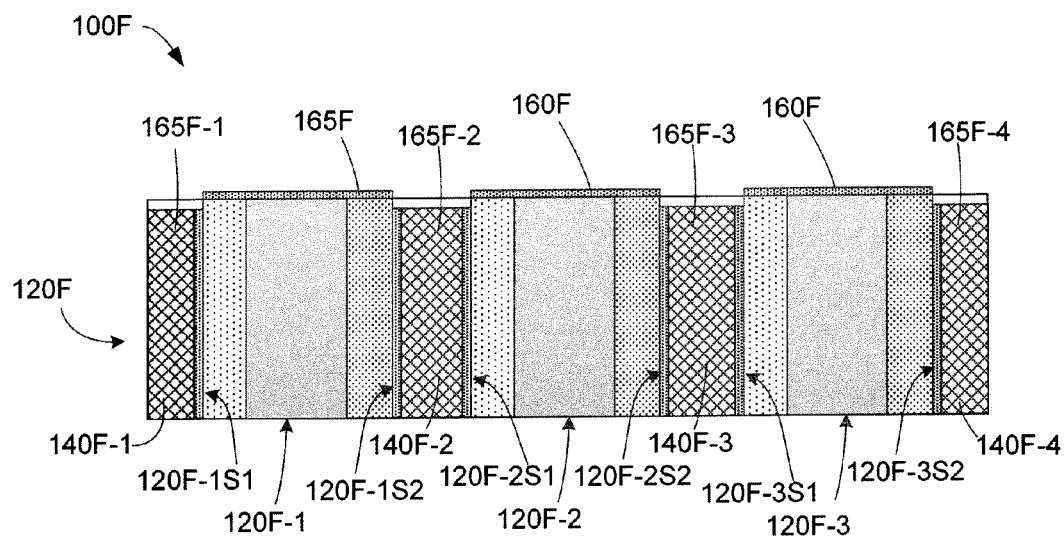
FIG. 16 is a simplified cross-sectional side elevation view depicting a trench leveling process utilized in conjunction with the process of FIG. 15.
Figure 17:
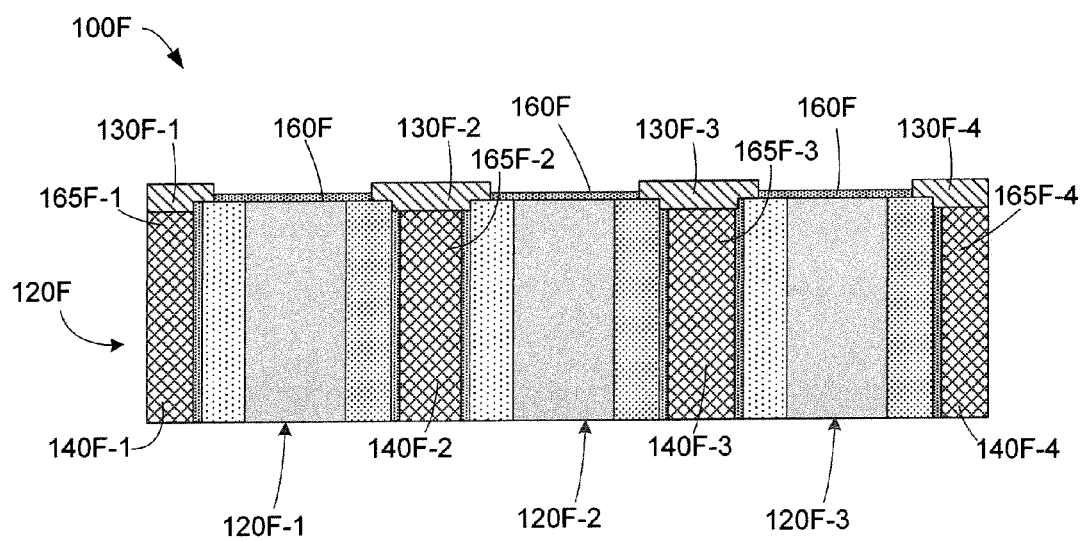
FIG. 17 is a simplified cross-sectional side elevation view depicting a metallization process utilized in conjunction with the process of FIG. 15.

FIGS. 15 to 17 depict processes utilized in the production of another "trench"-type photovoltaic device 100F, which is formed using silicon on SOI (10 um-40 um), and is considered by the inventors to represent a novel "vertical wall" version of a PERL solar cell. The P+ and N+ doped regions are formed by implantation at an angle into the Si trenches (as described above with reference to FIG. 14), or by diffusions penetrating to the SOI-BOX interface, with subsequent etch of trenches and their passivation by SiO₂ and with contact opening during the trench filling. In one specific embodiment (0.18 um power management process flow on SOI), the trenches are etched using a hard mask (consisting of an STI layer having a thickness in the range of approximately 3000 A (3000 angstroms) to 4000 A and a silicon nitride layer having a thickness in the range of 1000 A to 2000 A) before the CMOS formation, and the surface of the trench is oxidized (e.g., SiO₂ having a thickness in the range of 1000 A-4000 A). FIG. 15 shows device 100F after trenches 140E-1 to 140E-4 are defined between semiconductor layer portions 120E-1, 120E-2 and 120E-3 in the manner described above, and a passivation layer 160F (e.g., silicon dioxide or silicon nitride) is formed on all surfaces. Polycrystalline silicon 165F is then deposited such that it fills each trench 140E-1 to 140E-4. Next, as depicted in FIG. 16, leveling of the polysilicon is performed such that upper surfaces of polysilicon portions 165F-1 to 165F-4, which respectively remain in trenches 140E-1 to 140E-4 after the leveling process is completed, are below the upper surface of semiconductor layer portions 120E-1, 120E-2 and 120E-3 (e.g., the upper surfaces of polysilicon portions 165F-1 to 165F-4 are 1000 A to 4000 A. A wet/dry etch is then used to clean all oxide from the upper portions of each side wall 120E-1S1, 120E-1S2, 120E-2S1, 120E-2S2, 120E-3S1 and 120E-3S2, as is also shown in FIG. 16. Finally, as indicated in FIG. 17, electrically conductive structures 130E-1 to 130E-4 are formed on the upper surfaces of dielectric portions 165F-1 to 165F-4 to connect the adjacent P-I-N diodes formed on semiconductor layer portions 120E-1, 120E-2 and 120E-3 in the manner described above. The base structure is etched and cleaned such that an upper surface of the polysilicon is below the upper surface of the silicon, and such that the upper side wall surfaces are free of SiO₂. Metallization is then performed by forming a Ti/TiN barrier layer and depositing tungsten using CVD deposition onto the base structure D1.

In accordance with another embodiment of the present invention, when a photovoltaic device of the present invention (e.g., device 100 shown in FIG. 1) is formed using large area processing techniques (e.g., as part of a HV solar array formed on inexpensive SOI wafers such as crystalline or high quality thick polycrystalline silicon films on glass or other types of isolators), low cost metallization techniques may be utilized to form conductive structures 130-1 and 130-2. For example, in one specific embodiment metallization inside the trenches can be performed by aluminum deposition (e.g., on a Ti/TiN barrier) and mask, or by printing a conductive paste using an inkjet printer in the manner often used in solar cell technologies to form contacts to strongly doped silicon.

Although the present invention has been described with respect to certain specific embodiments, it will be clear to those skilled in the art that the inventive features of the present invention are applicable to other embodiments as well, all of which are intended to fall within the scope of the present invention. For example, although the bypass diodes are described above with specific reference to a "flat surface" photovoltaic device, it is understood that the bypass diodes may be included in the other disclosed embodiments as well (e.g., in photovoltaic devices described above having lateral P-I-N light-sensitive diodes separated by trenches). In addition, the metallization described above may be formed using other conductive materials that form low-resistance contacts with Si, such as a titanium-nitride stack, gold, or tungsten.

The invention claimed is:
1. A photovoltaic device comprising:
an insulating layer consisting of an electrically insulating material;
a plurality of parallel elongated semiconductor layer portions, each of said plurality of parallel elongated semiconductor layer portions having a lower surface contacting the insulating layer, and an upper surface facing away from said insulating layer,
wherein each parallel elongated semiconductor layer portion of said plurality of parallel elongated semiconductor layer portions comprises a lateral light-sensitive diode including an elongated P+ doped region formed by a P+ dopant diffused entirely through said each parallel elongated semiconductor layer portion from a first upper surface portion to a corresponding first portion of said lower surface, an elongated intrinsic region of said each parallel elongated semiconductor layer portion extending entirely through said each parallel elongated semiconductor layer portion from a second upper surface portion to a corresponding second portion of said lower surface, and an elongated N+ doped region formed by an N+ dopant diffused entirely through said each parallel elongated semiconductor layer portion from a third upper surface portion to a corresponding third portion of said lower surface, said elongated intrinsic region being disposed between said elongated P+ doped region and said elongated N+ doped region; and a plurality of electrically conductive structures, each electrically conductive structure being connected between the elongated N+ doped region of a first said lateral light-sensitive diode and the elongated P+ doped region of a second said lateral light-sensitive diode such that said each electrically conductive structure forms an electrically conductive path between the first and second lateral light-sensitive diodes, wherein said plurality of parallel elongated semiconductor layer portions comprise sequentially arranged sections of a contiguous semiconductor layer structure such that each parallel elongated semiconductor layer portion is connected to an adjacent semiconductor layer portion by an intervening intrinsic portion of said contiguous semiconductor layer structure, and wherein each electrically conductive structure of said plurality of electrically conductive structures is disposed on an associated said intervening intrinsic portion of said contiguous semiconductor layer structure such that a first portion of said each electrically conductive structure is disposed on said third upper surface portion of a first semiconductor layer portion, and a second portion of said each electrically conductive structure is disposed on said first upper surface portion of a second semiconductor layer portion.

2. The photovoltaic device according to claim 1, wherein the insulating layer comprises a silicon dioxide layer and the plurality of parallel elongated semiconductor layer portions comprise a polycrystalline silicon layer having a thickness in the range of 0.1 to 0.5 microns.

3. The photovoltaic device according to claim 1, wherein the insulating layer comprises a buried oxide layer and the plurality of parallel elongated semiconductor layer portions comprise a crystalline silicon layer having a thickness in the range of 0.1 to 4 microns.

4. The photovoltaic device according to claim 1, wherein the insulating layer comprises one of silicon dioxide, silicon nitride, glass, and plastic.

5. The photovoltaic device according to claim 1, wherein each of said plurality of electrically conductive structures comprises one of a silicide film, an aluminum film, a titanium film, a titanium-nitride stack, gold, and tungsten and a conductive paste film.

6. The photovoltaic device according to claim 1,
wherein said contiguous semiconductor layer structure comprises a layer of polycrystalline silicon, and
wherein each electrically conductive structure of said plurality of electrically conductive structures comprises a strip of silicide formed on said layer of polycrystalline silicon.

7. The photovoltaic device according to claim 1 comprising at least twenty parallel elongated semiconductor layer portions, each of said at least twenty parallel elongated semiconductor layer portions including an associated one said lateral light-sensitive diodes that are connected in series by said plurality of electrically conductive structures.

8. The photovoltaic device according to claim 1, further comprising a plurality of bypass diodes, each bypass diodes of the plurality of bypass diodes being connected in parallel with and arranged opposite in polarity with an associated one of said lateral light-sensitive diodes.

9. A photovoltaic device comprising:
an insulating layer consisting of an electrically insulating material;
a plurality of parallel elongated semiconductor layer portions, each of said plurality of parallel elongated semiconductor layer portions having a lower surface contacting the insulating layer, and an upper surface facing away from said insulating layer, wherein each parallel elongated semiconductor layer portion of said plurality of parallel elongated semiconductor layer portions comprises a lateral light-sensitive diode including an elongated P+ doped region formed by a P+ dopant diffused entirely through said each parallel elongated semiconductor layer portion from a first upper surface portion to a corresponding first portion of said lower surface, an elongated intrinsic region of said each parallel elongated semiconductor layer portion extending entirely through said each parallel elongated semiconductor layer portion from a second upper surface portion to a corresponding second portion of said lower surface, and an elongated N+ doped region formed by an N+ dopant diffused entirely through said each parallel elongated semiconductor layer portion from a third upper surface portion to a corresponding third portion of said lower surface, said elongated intrinsic region being disposed between said elongated P+ doped region and said elongated N+ doped region;
a plurality of electrically conductive structures, each electrically conductive structure being connected between the elongated N+ doped region of a first said lateral light-sensitive diode and the elongated P+ doped region of a second said lateral light-sensitive diode such that said each electrically conductive structure forms an electrically conductive path between the first and second lateral light-sensitive diodes; and
a plurality of bypass diodes, each bypass diodes of the plurality of bypass diodes being connected in parallel with and arranged opposite in polarity with an associated one of said lateral light-sensitive diodes,
wherein each said bypass diode comprises spaced-apart N+ and P+ diffusions disposed in a corresponding said semiconductor layer portion such that said N+ diffusion is aligned with and spaced from an end of said elongated P+ doped region and said P+ diffusion is aligned with and spaced from an end of said elongated N+ doped region, and
wherein each said electrically conductive structure is connected between the P+ diffusion region of a first said bypass diode disposed next to the first said lateral light-sensitive diode and the N+ diffusion of a second said bypass diode disposed next to the second said lateral light-sensitive diode.

10. A photovoltaic device comprising:
an insulating layer consisting of an electrically insulating material;
a plurality of parallel elongated semiconductor layer portions, each of said plurality of parallel elongated semiconductor layer portions having a lower surface contacting the insulating layer, and an upper surface facing away from said insulating layer, wherein each parallel elongated semiconductor layer portion of said plurality of parallel elongated semiconductor layer portions comprises a lateral light-sensitive diode including an elongated P+ doped region formed by a P+ dopant diffused entirely through said each parallel elongated semiconductor layer portion from a first upper surface portion to a corresponding first portion of said lower surface, an elongated intrinsic region of said each parallel elongated semiconductor layer portion extending entirely through said each parallel elongated semiconductor layer portion from a second upper surface portion to a corresponding second portion of said lower surface, and an elongated N+ doped region formed by an N+ dopant diffused entirely through said each parallel elongated semiconductor layer portion from a third upper surface portion to a corresponding third portion of said lower surface, said elongated intrinsic region being disposed between said elongated P+ doped region and said elongated N+ doped region;

a plurality of electrically conductive structures, each electrically conductive structure being connected between the elongated N+ doped region of a first said lateral light-sensitive diode and the elongated P+ doped region of a second said lateral light-sensitive diode such that said each electrically conductive structure forms an electrically conductive path between the first and second lateral light-sensitive diodes; and a plurality of bypass diodes, each bypass diodes of the plurality of bypass diodes being connected in parallel with and arranged opposite in polarity with an associated one of said lateral light-sensitive diodes, wherein each of the lateral light-sensitive diodes is at least ten times larger than each of the bypass diodes.

11. A photovoltaic device comprising:

an insulating layer consisting of an electrically insulating material;

a plurality of parallel elongated semiconductor layer portions, each of said plurality of parallel elongated semiconductor layer portions having a lower surface contacting the insulating layer, and an upper surface facing away from said insulating layer, wherein each parallel elongated semiconductor layer portion of said plurality of parallel elongated semiconductor layer portions comprises a lateral light-sensitive diode including an elongated P+ doped region formed by a P+ dopant diffused entirely through said each parallel elongated semiconductor layer portion from a first upper surface portion to a corresponding first portion of said lower surface, an elongated intrinsic region of said each parallel elongated semiconductor layer portion extending entirely through said each parallel elongated semiconductor layer portion from a second upper surface portion to a corresponding second portion of said lower surface, and an elongated N+ doped region formed by an N+ dopant diffused entirely through said each parallel elongated semiconductor layer portion from a third upper surface portion to a corresponding third portion of said lower surface, said elongated intrinsic region being disposed between said elongated P+ doped region and said elongated N+ doped region; and a plurality of electrically conductive structures, each electrically conductive structure being connected between the elongated N+ doped region of a first said lateral light-sensitive diode and the elongated P+ doped region of a second said lateral light-sensitive diode such that said each electrically conductive structure forms an electrically conductive path between the first and second lateral light-sensitive diodes, wherein each of said elongated P+ doped regions and each of said elongated N+ doped regions includes a corresponding side wall extending from the upper surface to the lower surface of each said semiconductor layer portion such that a trench is defined between each adjacent pair of said semiconductor layer portions.

12. The photovoltaic device according to claim 11, wherein each of the plurality of electrically conductive structures includes a first portion formed on a first side wall of a first semiconductor layer portion, a second portion formed on a second side wall of a second semiconductor layer portion, and a third portion disposed on a portion of the insulating layer located between the first and second side walls.

13. The photovoltaic device according to claim 11, further comprising a polycrystalline silicon portion disposed in each said trench defined between each adjacent pair of said semiconductor layer portions, and wherein each of the plurality of electrically conductive structures is disposed on a corresponding one of said polycrystalline silicon portions.

14. A CMOS integrated circuit device including a CMOS circuit and an embedded photovoltaic device fabricated on a single-crystal semiconductor substrate and operably connected such that power generated by said photovoltaic device is supplied to said CMOS circuit, wherein the photovoltaic device comprises:

an insulating layer disposed on the semiconductor substrate;

a plurality of parallel elongated semiconductor layer portions, each of said plurality of semiconductor layer portions having a lower surface contacting the insulating layer, and an upper surface facing away from said insulating layer, wherein each parallel elongated semiconductor layer portion of said plurality of parallel elongated semiconductor layer portions comprises a lateral light-sensitive diode including an elongated P+ doped region formed by a P+ dopant diffused entirely through said each parallel elongated semiconductor layer portion from a first upper surface portion to a corresponding first portion of said lower surface, an elongated intrinsic region of said each parallel elongated semiconductor layer portion extending entirely through said each parallel elongated semiconductor layer portion from a second upper surface portion to a corresponding second portion of said lower surface, and an elongated N+ doped region formed by an N+ dopant diffused entirely through said each parallel elongated semiconductor layer portion from a third upper surface portion to a corresponding third portion of said lower surface, said elongated intrinsic region being disposed between said elongated P+ doped region and said elongated N+ doped region; and a plurality of electrically conductive structures, each electrically conductive structure being connected between the elongated N+ doped region of a first said lateral light-sensitive diode and the elongated P+ doped region of a second said lateral light-sensitive diode such that said each metal film structure forms a electrically conductive path between the first and second lateral light-sensitive diodes, wherein said plurality of parallel elongated semiconductor layer portions comprise sequentially arranged sections of a contiguous semiconductor layer structure such that each parallel elongated semiconductor layer portion is connected to an adjacent semiconductor layer portion by an intervening intrinsic portion of said contiguous semiconductor layer structure, and wherein each electrically conductive structure of said plurality of electrically conductive structures is disposed on an associated said intervening intrinsic portion of said contiguous semiconductor layer structure such that a first portion of said each electrically conductive structure is disposed on said third upper surface portion of a first semiconductor layer portion, and a second portion of said each electrically conductive structure is disposed on said first upper surface portion of a second semiconductor layer portion.

15. A method for producing a photovoltaic device comprising:
- forming a plurality of lateral light-sensitive diodes in at least one semiconductor layer disposed on an insulating layer such that each said light-sensitive diode is disposed in a corresponding semiconductor layer portion of said at least one semiconductor layer, wherein forming each said light-sensitive diode includes diffusing a P+ dopant into an elongated P+ doped region of said corresponding semiconductor layer portion and by diffusing a N+ dopant into an elongated N+ doped region of said corresponding semiconductor layer portion such that an elongated intrinsic region of said corresponding semiconductor layer portion extends entirely through said corresponding semiconductor layer portion from said upper surface to said lower surface and entirely separates said elongated P+ doped region from said elongated N+ doped region; and
- forming a plurality of electrically conductive structures between adjacent pairs of said plurality of lateral light-sensitive diodes such that each said electrically conductive structure is connected between the elongated N+ doped region of a first said lateral light-sensitive diode and the elongated P+ doped region of a second said lateral light-sensitive diode, whereby said each electrically conductive structure forms a electrically conductive path between said adjacent pair of lateral light-sensitive diodes.

16. The method of claim 15, wherein forming the plurality of lateral light-sensitive diodes comprises implanting said P+ dopant and said N+ dopant into a contiguous silicon layer, and thermally treating said polycrystalline silicon layer such that said P+ dopant and said N+ dopant diffuses entirely through said silicon layer from an upper surface to a lower surface contacting the insulating layer.

17. The method of claim 15, wherein forming said plurality of electrically conductive structures comprises inkjet printing a conductive paste.

18. The method of claim 15, wherein forming the plurality of lateral light-sensitive diodes further comprises etching said contiguous silicon layer such that a trench is formed between each adjacent pair of semiconductor layer portions, and such that each semiconductor layer portion has a first side wall facing a first direction into a first trench disposed on a first side of said each semiconductor layer portion, and a second side wall facing a second direction into a second trench disposed on a first side of said each semiconductor layer portion, the second side being opposite to the first side.

19. The method of claim 18, further comprising forming at least one oxide layer on the first and second side walls of each semiconductor layer portion before forming said plurality of electrically conductive structures.

20. The method of claim 18, wherein etching said contiguous silicon layer is performed after diffusing said P+ dopant into said elongated P+ doped region of each said corresponding semiconductor layer portion, and after diffusing said N+ dopant into said elongated N+ doped region of each said corresponding semiconductor layer portion.

21. The method of claim 18,
wherein diffusing said P+ dopant into said elongated P+ doped region of each said corresponding semiconductor layer portion comprises implanting said P+ dopant at a first tilt angle into each said trench such that said P+ dopant is directed only onto and implanted only into said first side wall of each of said plurality of semiconductor layer portions, and
wherein diffusing said N+ dopant into said elongated N+ doped region of each said corresponding semiconductor layer portion comprises implanting said N+ dopant at a second tilt angle into each said trench such that said N+ dopant is directed only onto and implanted only into said second side wall of each of said plurality of semiconductor layer portions.

22. The method of claim 18, further comprising depositing polycrystalline silicon into each said trench, leveling said deposited polycrystalline silicon such that an upper surface of each portion of said deposited polycrystalline silicon remaining in said each trench is below the upper surface of said plurality of semiconductor layer portions, and cleaning upper portions of each said first and second side walls of each of said plurality of semiconductor layer portions before forming said plurality of electrically conductive structures, wherein forming said plurality of electrically conductive structures comprises depositing a barrier layer comprising at least one of titanium and titanium-nitride on said deposited polycrystalline silicon and said upper portions of each said first and second side walls of each of said plurality of semiconductor layer portions, and then depositing tungsten onto said barrier layer.

* * * * *